(12) United States Patent
Zhang et al.

(10) Patent No.: US 10,347,856 B2
(45) Date of Patent: Jul. 9, 2019

(54) LIGHT DETECTOR

(71) Applicants: Tsinghua University, Beijing (CN); HON HAI PRECISION INDUSTRY CO., LTD., New Taipei (TW)

(72) Inventors: Jin Zhang, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 27 days.

(21) Appl. No.: 15/613,180

(22) Filed: Jun. 3, 2017

(65) Prior Publication Data

US 2018/0006255 A1   Jan. 4, 2018

(30) Foreign Application Priority Data

Jul. 1, 2016 (CN) .......................... 2016 1 0502875

(51) Int. Cl.
| | |
|---|---|
| *H01L 51/42* | (2006.01) |
| *H01L 51/00* | (2006.01) |
| *H01L 51/05* | (2006.01) |
| *B82Y 40/00* | (2011.01) |
| *C30B 29/46* | (2006.01) |
| *B82Y 10/00* | (2011.01) |

(Continued)

(52) U.S. Cl.
CPC .......... *H01L 51/4213* (2013.01); *C22C 26/00* (2013.01); *H01L 51/0012* (2013.01); *H01L 51/0026* (2013.01); *H01L 51/0048* (2013.01); *H01L 51/0562* (2013.01); *B82Y 10/00* (2013.01); *B82Y 20/00* (2013.01); *B82Y 40/00* (2013.01); *C22C 2026/002* (2013.01); *C30B 29/46* (2013.01); *C30B 33/00* (2013.01); *Y02E 10/549* (2013.01); *Y10S 977/75* (2013.01); *Y10S 977/827* (2013.01); *Y10S 977/842* (2013.01); *Y10S 977/938* (2013.01); *Y10S 977/954* (2013.01)

(58) Field of Classification Search
CPC ............. H01L 51/0012; H01L 51/0026; H01L 51/0048; H01L 51/0562; H01L 51/4213; H01L 51/0508; B82Y 40/00; Y02E 10/549; Y10S 977/954; Y10S 977/75; Y10S 977/827; Y10S 977/842; C30B 29/46

See application file for complete search history.

(56) References Cited

U.S. PATENT DOCUMENTS

| | | | |
|---|---|---|---|
| 2006/0065887 A1* | 3/2006 | Tiano ................ | B82Y 10/00 257/20 |
| 2012/0153119 A1 | 6/2012 | Patil et al. | |
| 2014/0263945 A1* | 9/2014 | Huang ................. | H01L 51/428 250/200 |

FOREIGN PATENT DOCUMENTS

WO   WO2012/015115   2/2012

* cited by examiner

*Primary Examiner* — Caridad Everhart
(74) *Attorney, Agent, or Firm* — ScienBiziP, P.C.

(57) ABSTRACT

The present disclosure relates to a light detector. The light detector includes a first electrode, a second electrode, a current detector, a power source and a nano-heterostructure. The nano-heterostructure is electrically coupled with the first electrode and the second electrode. The nano-heterostructure includes a first carbon nanotube, a second carbon nanotube and a semiconductor layer. The semiconductor layer includes a first surface and a second surface opposite to the first surface. The first carbon nanotube is located on the first surface, the second carbon nanotube is located on the second surface.

18 Claims, 6 Drawing Sheets

(51) Int. Cl.
  *B82Y 20/00* (2011.01)
  *C22C 26/00* (2006.01)
  *C30B 33/00* (2006.01)

LIGHT DETECTOR

CROSS-REFERENCE TO RELATED APPLICATIONS

This application claims all benefits accruing under 35 U.S.C. § 119 from China Patent Application No. 201610502875.0, filed on Jul. 1, 2016, in the China Intellectual Property Office, the contents of which are hereby incorporated by reference.

FIELD

The present disclosure relates to a light detector.

BACKGROUND

A heterojunction is an interface region formed by a contact of two different semiconductor materials. According to the conductivity types of different semiconductor materials, the heterojunction can be divided into homogeneous heterojunction (P-p junction or N-n junction) and heterotypic heterojunction (P-n or p-N). A heterostructure can be formed by multilayer heterojunctions.

Since two-dimensional semiconductor materials have excellent electronic and optical properties, the two-dimensional semiconductor materials are researched more and more in recent years. However, the heterogeneous structures of the two-dimensional semiconductor materials obtained by conventional methods often have a large size, applications of the two-dimensional semiconductor materials are limited.

BRIEF DESCRIPTION OF THE DRAWINGS

Implementations of the present technology will now be described, by way of example only, with reference to the attached figures, wherein.

DETAILED DESCRIPTION

Figure 1:
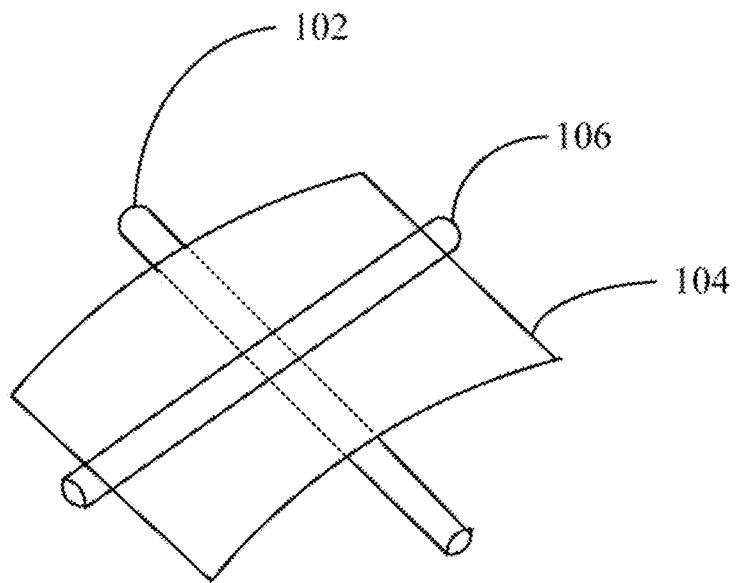
FIG. 1 is a structure schematic view of one embodiment of a nano-heterostructure.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 2:
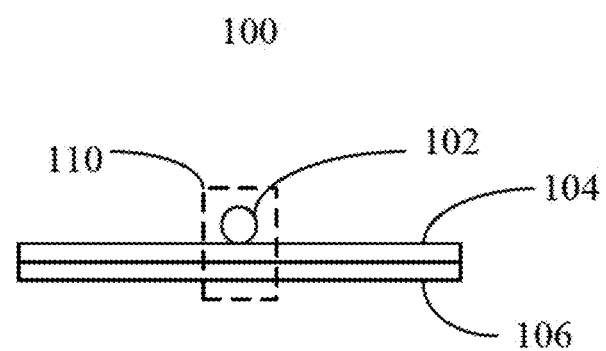
FIG. 2 is a side structure schematic view of the nano-heterostructure in FIG. 1.

Referring to FIGS. 1-2, one embodiment is described in relation to a nano-heterostructure 100. The nano-heterostructure 100 comprises a first carbon nanotube 102, a semiconductor layer 104 and a second carbon nanotube 106. The semiconductor layer 104 is located between the first carbon nanotube layer 102 and the second carbon nanotube 106. A thickness of the semiconductor layer 104 is ranged from 1 nanometer to about 100 nanometers. The semiconductor layer 104 has a film structure defining two opposite surfaces. The first carbon nanotube 102 is oriented along a first direction and located on one of the two opposite surfaces. The second carbon nanotube 106 is oriented along a second direction and located on another one of the two opposite surfaces. The semiconductor layer 104 is sandwiched between the first carbon nanotube 102 and the second carbon nanotube 106. An angle between the first carbon nanotube 102 and the second carbon nanotube 106 is larger than 0 degrees and less than or equal to 90 degrees.

The first carbon nanotube 102 can be a single-walled carbon nanotube, a double-walled carbon nanotube, or a multi-walled carbon nanotube. A diameter of the first carbon nanotube 102 can be ranged from about 0.5 nanometers to about 150 nanometers. In one embodiment, the diameter of the first carbon nanotube 102 ranges from about 0.5 nanometers to about 10 nanometers. In another embodiment, the first carbon nanotube 102 is a single-walled carbon nanotube, and the diameter of the first carbon nanotube 102 is in a range from about 1 nanometer to about 5 nanometers. In one embodiment, the first carbon nanotube 102 is a metallic single-walled carbon nanotube, and the diameter of the first carbon nanotube 102 is about 1 nanometer.

The semiconductor layer 104 can be a two-dimensional structure. A thickness of the semiconductor layer 104 can be ranged from about 1 nanometer to about 200 nanometers. In one embodiment, the thickness of the semiconductor layer 104 ranges from about 1 nanometers to about 10 nanometers. In another embodiment, the thickness of the semiconductor layer 104 is about 2 nanometers. A material of the semiconductor layer 104 can be inorganic compound semiconductors, elemental semiconductors or organic semiconductors. The semiconductor layer 104 can be P type or N type. Such as gallium arsenide, silicon carbide, polysilicon, monocrystalline silicon, naphthalene or molybdenum sulfide. In one embodiment, the material of the semiconductor layer 104 is transition metal sulfide. In one embodiment, the material of the semiconductor layer 104 is Molybdenum sulfide ($MoS_2$), and the thickness of the semiconductor layer 104 is about 2 nanometers.

The second carbon nanotube 106 can be a single-walled carbon nanotube, double-walled carbon nanotube, or multi-walled carbon nanotube. A diameter of the second carbon nanotube 106 can be ranged from about 0.5 nanometers to about 150 nanometers. In one embodiment, the diameter of the second carbon nanotube 106 ranges from about 0.5 nanometers to about 10 nanometers. In another embodiment, the second carbon nanotube 106 is a single-walled carbon nanotube, and the diameter of the second carbon nanotube 106 is in a range from about 1 nanometer to about 5 nanometers. In one embodiment, the second carbon nanotube 106 is a metallic single-walled carbon nanotube, and the diameter of the second carbon nanotube 106 is about 1 nanometer.

The first carbon nanotube 102 and the second carbon nanotube 106 are crossed with each other and separated from each other by the semiconductor layer 104. In one embodiment, the angle between the first carbon nanotube 102 and the second carbon nanotube 106 is larger than 60 degrees and less than or equal to 90 degrees. In another embodiment, the angle between the first carbon nanotube 102 and the second carbon nanotube 106 is 90 degrees. A three-layered stereoscopic structure 110 can be formed at an intersection of the first carbon nanotube 102, the semiconductor layer 104 and the second carbon nanotube 106. Since the first carbon nanotube 102 and the second carbon nanotube 106 are both nanomaterials, the cross-sectional area of the three-layered stereoscopic structure 110 is nanoscale. In one embodiment, the cross-sectional area of the three-layered stereoscopic structure 110 ranges from about 0.25 $nm^2$ to about 1000 $nm^2$. In another embodiment, the cross-sectional area of the three-layered stereoscopic structure 110 ranges from about 0.25 $nm^2$ to about 100 $nm^2$.

A Wan der Waals heterostructure is formed by the three-layered stereoscopic structure 110 between the first carbon nanotube 102, the semiconductor layer 104 and the second carbon nanotube 106. In use of the nano-heterostructure 100, a Schottky junction is formed between the first carbon nanotube 102, the semiconductor layer 104 and the second carbon nanotube 106 in the three-layered stereoscopic structure 110. A current can get through the three-layered stereoscopic structure 110. The first carbon nanotube 102 and the second carbon nanotube 106 are nanomaterials, and the cross-sectional area of the three-layered stereoscopic structure 110 is also nanoscale, i.e., a nano-heterostructure 100 is obtained. The nano-heterostructure 100 has a lower energy consumption, a higher spatial resolution, and a higher integrity.

Figure 3:
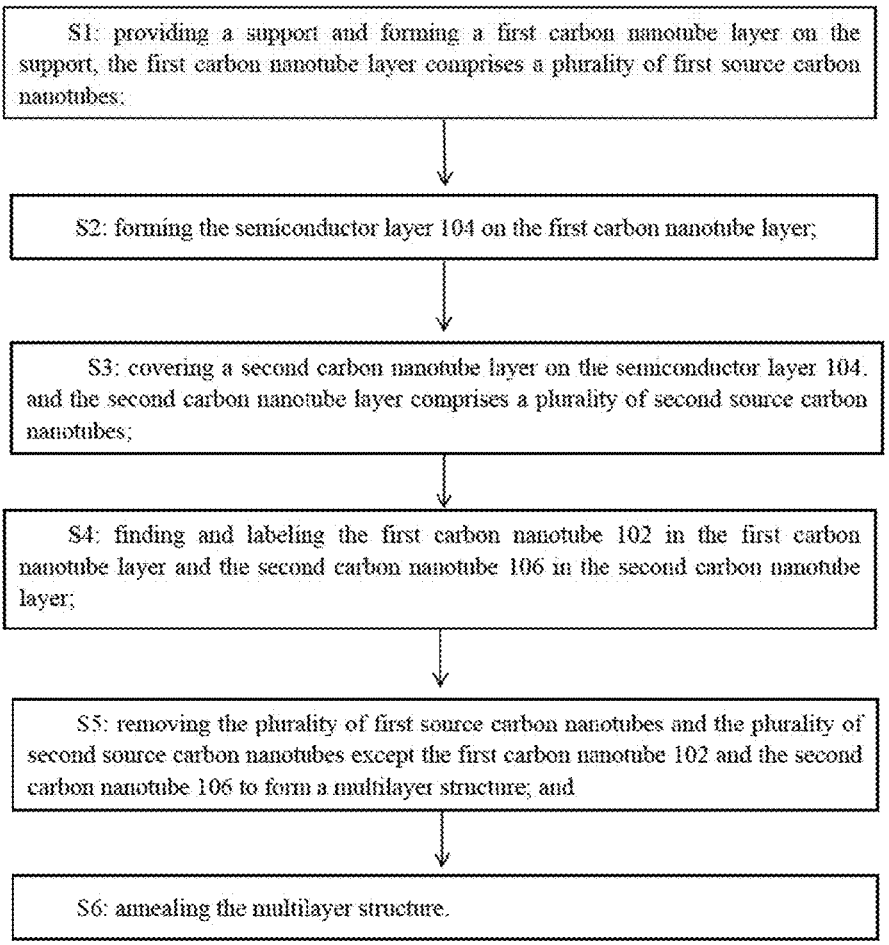
FIG. 3 is a flow chart of one embodiment of a method for making a nano-heterostructure.

Referring to FIG. 3, one embodiment is described in relation to a method for making the nano-heterostructure 100. The method comprises the following steps:

S1: providing a support and forming a first carbon nanotube layer on the support, the first carbon nanotube layer comprises a plurality of first source carbon nanotubes;

S2: forming the semiconductor layer 104 on the first carbon nanotube layer;

S3: covering a second carbon nanotube layer on the semiconductor layer 104, and the second carbon nanotube layer comprises a plurality of second source carbon nanotubes;

S4: finding and labeling the first carbon nanotube 102 in the first carbon nanotube layer and the second carbon nanotube 106 in the second carbon nanotube layer;

S5: removing the plurality of first source carbon nanotubes and the plurality of second source carbon nanotubes except for the first carbon nanotube 102 and the second carbon nanotube 106 to form a multilayer structure; and S6: annealing the multilayer structure.

In step S1, the support is used to support the first carbon nanotube layer. A material of the support is not limited. In one embodiment, the material of the support is insulation material. In one embodiment, the support is a double-layer structure comprising a lower layer and an upper layer. The lower layer can be made of conductive material. The upper layer can be made of insulating material. In one embodiment, the lower layer is made of silicon material, and the upper layer is silicon oxide with a thickness of 300 nanometers. The plurality of first source carbon nanotubes can be crossed or parallel to each other. In one embodiment, the plurality of first source carbon nanotubes is parallel with each other and oriented along a first direction.

A method for forming the first carbon nanotube layer on the support can be a transfer method comprising the following steps:

S11: growing the first carbon nanotube layer on a substrate;

S12: coating a transition layer on a surface of the first carbon nanotube layer;

S13: separating the transition layer and the first carbon nanotube layer from the substrate; and S14: putting the transition layer adhered with the first carbon nanotube layer on the support and removing the transition layer to make the first carbon nanotube layer formed on the support.

In step S11, the substrate can be a silicon substrate.

In step S12, a material of the transition layer can be polymethyl methacrylate (PMMA), and a thickness of the transition layer can be ranged from about 0.1 microns to about 1 micron.

In one embodiment, in step S13, a method for separating the transition layer and the first carbon nanotube layer from the substrate comprises the steps of: transferring the first carbon nanotube layer coated with the transition layer and the substrate into an alkaline solution, and heating the alkaline solution to a temperature ranged from about 70° C. to about 90° C. The first carbon nanotube layer is transferred to the transition layer. The alkaline solution can be sodium hydroxide solution or potassium hydroxide solution. In one embodiment, transferring the first carbon nanotube layer coated with the transition layer and the substrate into potassium hydroxide solution, heating the potassium hydroxide solution to about 90° C. for about 20 minutes.

In step S14, in one embodiment, the PMMA was removed by acetone dissolution.

In step S2, a method for forming the semiconductor layer 104 on the first carbon nanotube layer comprises the sub-steps of: providing a semiconductor crystal, tearing the semiconductor crystal several times by a tape until a two-dimensional semiconductor layer is formed on the tape, then disposing the two-dimensional semiconductor layer on the surface of the first carbon nanotube layer, and removing the tape. In one embodiment, a molybdenum sulfide single crystal is torn several times by the tape until a molybdenum sulfide layer with nano-thickness is formed on the tape; the tape coated with the molybdenum sulfide layer is covered on the surface of the first carbon nanotube layer; the tape is removed, and at least part of the molybdenum sulfide layer remains on the surface of the first carbon nanotube layer.

In step S3, the plurality of second source carbon nanotubes can be arranged substantially along the same direction. In one embodiment, the plurality of second source carbon nanotubes are parallel to each other and oriented along a second direction. The second direction is substantially perpendicular to the first direction. A method for covering the second carbon nanotube layer on the semiconductor layer 104 can be a transfer method. The transfer method of the second carbon nanotube layer is the same as that of the first carbon nanotube layer.

In one embodiment, step S4 comprises the sub-steps of: finding the first carbon nanotube 102 from the first carbon nanotube layer via a scanning electron microscopy (SEM); labeling the coordinate positions of the first carbon nanotube 102; finding the second carbon nanotube 106 from the second carbon nanotube layer via the scanning electron microscopy (SEM); and, labeling a coordinate position of the second carbon nanotube 106.

In another embodiment, step S4 comprises: building an XY rectangular coordinate system along with a length direction and a width direction of the support; then finding the first metallic carbon nanotube 102, the second carbon nanotube 106, and reading out the coordinate values of the first carbon nanotube 102 and the second carbon nanotube 106.

Step S5 comprises sub-steps of: protecting the first carbon nanotube 102 and the second carbon nanotube 106 by electron beam exposure, exposing the plurality of first source carbon nanotubes and the plurality of second source carbon nanotubes except the first carbon nanotube 102 and the second carbon nanotube 106, and etching away the plurality of first source carbon nanotubes and the plurality of second source carbon nanotubes except the first carbon nanotube 102 and the second carbon nanotube 106 by plasma etching.

In step S6, the annealing the multilayer structure obtained by above steps is carried out in a vacuum atmosphere. An annealing temperature can be ranged from about 300° C. to about 400° C. After annealing, impurities on a surface of the nano-heterostructure 100 can be removed, and a contact between the first carbon nanotube layer, the semiconductor layer 104 and the second carbon nanotube layer can be better.

Figure 4:
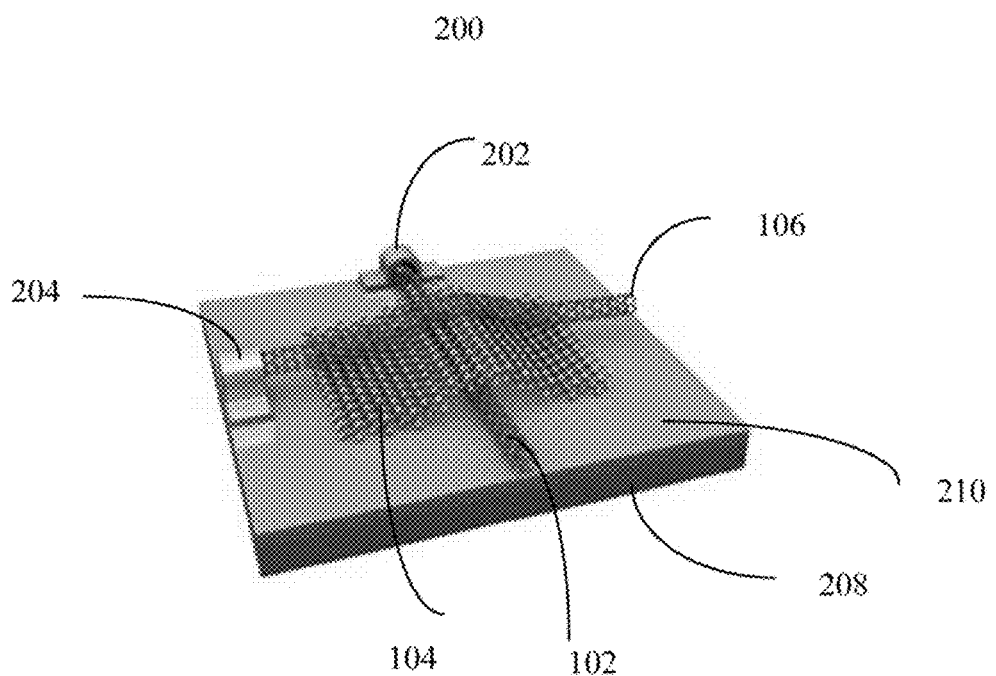
FIG. 4 is structure schematic view of one embodiment of a nano-scale transistor.

Referring to FIG. 4, one embodiment is described in relation to a nano-scale transistor 200. The nano-scale transistor 200 comprises a source electrode 202, a drain electrode 204 a gate electrode 208 and the nano-heterostructure 100. The nano-heterostructure 100 is electrically coupled with the source electrode 202 and the drain electrode 204. The gate electrode 208 is insulated from the nano-heterostructure 100 via an insulating layer 210. The drain electrode 204 is electrically coupled with the first carbon nanotube 102. The source electrode 202 is electrically coupled with the second carbon nanotube 106.

The source electrode 202, the drain electrode 204 and the gate electrode 208 are made of conductive material, such as metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, the source electrode 202 and the drain electrode 204 are both conductive films. A thickness of the conductive film is ranged from about 2 microns to about 100 microns. In one embodiment, the source electrode 202 and the drain electrode 204 are metal composite structures formed by compounding metal Au on a surface of metal Ti. A thickness of the metal Ti is ranged from about 2 nanometers. A thickness of the metal Au is about 50 nanometers. In one embodiment, the source electrode 202 is located at one end of the first carbon nanotube 102 and adhered to a surface of the first carbon nanotube 102, the source electrode 202 comprises a layer of metal Ti and a layer of Metal Au, the metal Ti is located on the surface of the first carbon nanotube 102, the metal Au is located on the metal Ti. In one embodiment, the drain electrode 204 is located at one end of the second carbon nanotube 106 and adhered to a surface of the second carbon nanotube 106, the drain electrode 204 comprises a layer of metal Ti and a layer of Metal Au, the metal Ti is located on the surface of the second carbon nanotube 106, the metal Au is located on the metal Ti. In one embodiment, the gate electrode 208 has a sheet shape, the insulating layer 210 li located on the gate electrode 208, the source electrode 202, the drain electrode 204 and the nano-heterostructure 100 are located on a surface of the insulating layer 210 and supported by the gate electrode 208.

In use of the nano-scale transistor 200, if the semiconductor layer 104 is an N-type semiconductor, a parabolic voltage is kept unchanged between the source electrode 202 and the drain electrode 204, if a positive voltage is applied to the gate electrode 208, a current passes trough the source electrode 202 and the drain electrode 204, the nano-scale transistor 200 is in on-status, the current passes through the source electrode 202, the first carbon nanotube 102, the three-layered stereoscopic structure 110, the second carbon nanotube 106, and the drain electrode 204; if a negative voltage is applied to the gate electrode 208, the nano-scale transistor 200 is in off-status. The nano-scale transistor 200 has a high on/off ratio, about $10^5$.

Figure 5:
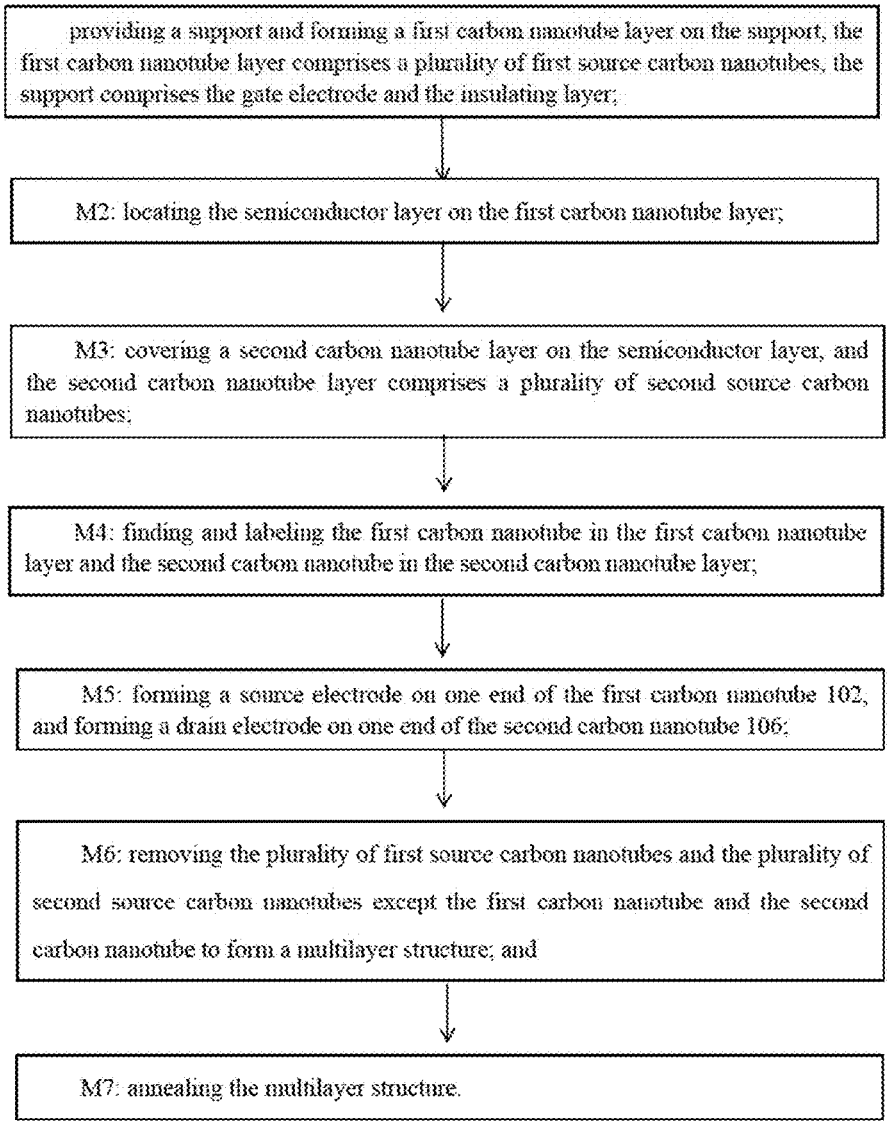
FIG. 5 is a flow chart of one embodiment of a method for making a nano-scale transistor.

Referring to FIG. 5, one embodiment is described in relation to a method for making the nano-scale transistor 200. The method comprises the following steps:

M1: providing a support and forming a first carbon nanotube layer on the support, the first carbon nanotube layer comprises a plurality of first source carbon nanotubes, the support comprises the gate electrode 208 and the insulating layer 210;

M2: locating the semiconductor layer 104 on the first carbon nanotube layer;

M3: covering a second carbon nanotube layer on the semiconductor layer 104, and the second carbon nanotube layer comprises a plurality of second source carbon nanotubes;

M4: finding and labeling the first carbon nanotube 102 in the first carbon nanotube layer and the second carbon nanotube 106 in the second carbon nanotube layer;

M5: forming a source electrode 202 on one end of the first carbon nanotube 102, and forming a drain electrode 204 on one end of the second carbon nanotube 106;

M6: removing the plurality of first source carbon nanotubes and the plurality of second source carbon nanotubes except for the first carbon nanotube 102 and the second carbon nanotube 106 to form a multilayer structure; and M7: annealing the multilayer structure.

Characteristics of the step M1 are the same as S1 disclosed above.

Characteristics of the step M2 are the same as S2 disclosed above.

Characteristics of the step M3 are the same as S3 disclosed above.

Characteristics of the step M4 are the same as S4 disclosed above.

In step M5, the source electrode 202 can be formed on the end of the first carbon nanotube 102 by an electron beam exposure method. The drain electrode 204 can be formed on the end of the second carbon nanotube 106 by an electron beam exposure method.

Characteristics of the step M6 are the same as S5 disclosed above.

Characteristics of the step M7 are the same as S6 disclosed above.

Figure 6:
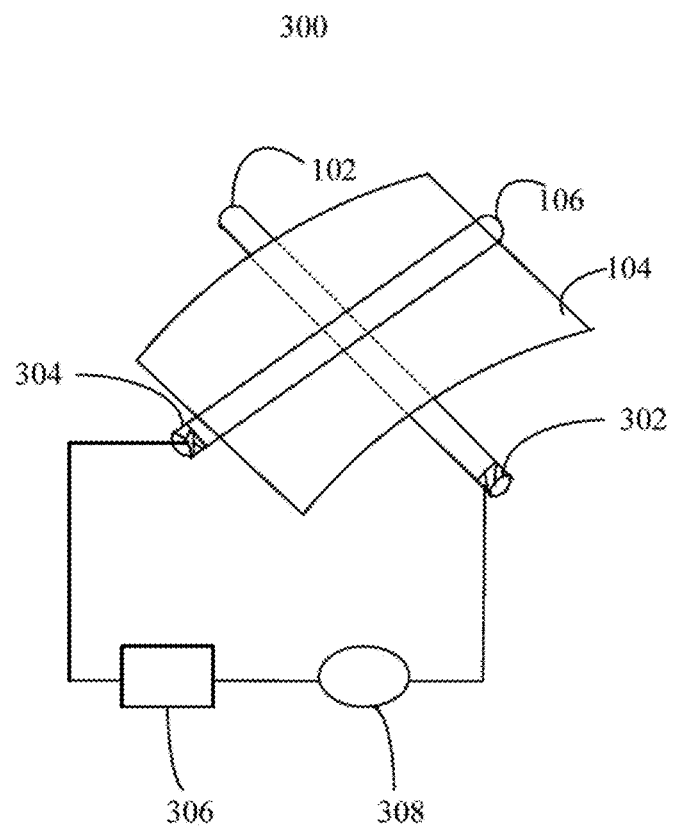
FIG. 6 is a structure schematic view of one embodiment of a light detector.

Referring to FIG. 6, a light detector 300 according to one embodiment is provided. The light detector 300 includes the nano-heterostructure 100, a first electrode 302, a second electrode 304, a current detector 306 and a power source 308. The nano-heterostructure 100 includes the first carbon nanotube 102, the semiconductor layer 104, the second carbon nanotube 106 and the three-layered stereoscopic structure 110. The first carbon nanotube 102 is electrically coupled with the first electrode 302. The second carbon nanotube 106 is electrically coupled with the second electrode 304. The first electrode 302, the second electrode 304 are electrically coupled with the current detector 306. The power 308, the first electrode 302, the second electrode 304 and the current detector 306 are electrically coupled with each other to form a circuit. The three-layered stereoscopic structure 110 is a detecting point of the light detector 300. If a light is irradiated on the three-layered stereoscopic structure 110, the light can be detected by the light detector 300.

The first electrode 302 and the second electrode 304 are made of conductive material, such as metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, the first electrode 302 and the second electrode 304 are both conductive films. A thickness of the conductive film is ranged from about 2 microns to about 100 microns. In one embodiment, the first electrode 302 and the second electrode 304 are metal composite structures formed by compounding metal Au on a surface of metal Ti. A thickness of the metal Ti is ranged from about 2 nanometers. A thickness of the metal Au is about 50 nanometers. In one embodiment, the first electrode 302 is located at one end of the first carbon nanotube 102 and adhered to a surface of the first carbon nanotube 102, the first electrode 302 comprises a layer of metal Ti and a layer of Metal Au, the metal Ti is located on the surface of the first carbon nanotube 102, the metal Au is located on the metal Ti. In one embodiment, the second electrode 304 is located at one end of the second carbon nanotube 106 and adhered to a surface of the second carbon nanotube 106, the second electrode 304 comprises a layer of metal Ti and a layer of Metal Au, the metal Ti is located on the surface of the second carbon nanotube 106, the metal Au is located on the metal Ti.

The current detector 306 is configured to detector if there is a current passing through the first electrode 302 to the second electrode 304. The current detector 306 can be an ammeter. The power 308 is used to apply a voltage between the first electrode 302 and the second electrode 304.

The light detector 300 can be used as a quantitative detection of light. The working principle of the light detector 300 comprises: turning on power 308, applying a voltage between the first electrode 302 and the second electrode 304, if no light is irradiated on the semiconductor layer 104, no photogenerated carriers are produced in the semiconductor layer 104, the nano-heterostructure 100 is on off-status, and no current passes through the circuit including the nano-heterostructure 100, the current detector 306 cannot detect a current; if a light is emitted on the semiconductor layer 104, photogenerated carriers are produced in the semiconductor layer 104, the nano-heterostructure 100 is on on-status, a current passes through the circuit including the nano-heterostructure 100, and the current detector 306 can detect the current.

The light detector 300 can also be used as a qualitative detection of light. The working principle of the light detector 300 comprises: turning on power 308, applying a voltage between the first electrode 302 and the second electrode 304, emitting light with different strength on the semiconductor layer 104 in turn, writing on the different current values corresponding to light with different strength, and drawing a graph about light strength and current values. If a light with unknown strength is emitted on the semiconductor layer 104, a current value corresponding the light can be detected, and according to the graph about light strength and current values, the strength of the light can be known.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A light detector comprising:
    a first electrode, a second electrode, a current detector, a power source and a nano-heterostructure; the nano-heterostructure being electrically coupled with the first electrode and the second electrode, wherein a circuit is formed by the first electrode, the second electrode, the current detector, the power source and the nano-heterostructure; and the nano-heterostructure comprises:
        a semiconductor layer with a thickness ranging from 1 nanometer to 100 nanometers, and the semiconductor layer comprising a first surface and a second surface, wherein a material of the semiconductor layer is Molybdenum sulfide;
        a first carbon nanotube located on the first surface and arranged along a first direction; and
        a second carbon nanotube located on the second surface and arranged along a second direction different from the first direction, and the second carbon nanotube being crossed with the first carbon nanotube.

2. The light detector of claim 1, wherein the first electrode is located at one end of the first carbon nanotube and adhered on a surface of the first carbon nanotube.

3. The light detector of claim 1, wherein the second electrode is located at one end of the second carbon nanotube and adhered on a surface of the second carbon nanotube.

4. The light detector of claim 1, wherein a diameter of the first carbon nanotube ranges from 1 nanometer to 10 nanometers.

5. The light detector of claim 1, wherein a diameter of the second carbon nanotube ranges from 1 nanometer to 10 nanometers.

6. The light detector of claim 1, wherein a thickness of the semiconductor layer ranges from about 1 nanometer to about 10 nanometers.

7. The light detector of claim 1, wherein a material of the semiconductor layer is inorganic compound semiconductors, elemental semiconductors, or organic semiconductors.

8. The light detector of claim 1, wherein a thickness of the semiconductor layer is about 2 nanometers.

9. The light detector of claim 1, wherein the first carbon nanotube is a metallic carbon nanotube.

10. The light detector of claim 9, wherein the first carbon nanotube is a single-walled carbon nanotube.

11. The light detector of claim 1, wherein the second carbon nanotube is a metallic carbon nanotube.

12. The light detector of claim 11, wherein the second carbon nanotube is a single-walled carbon nanotube.

13. The light detector of claim 1, wherein an angle between the first carbon nanotube and the second carbon nanotube is larger than 0 degrees and less than or equal to 90 degrees.

14. The light detector of claim 13, wherein the angle is larger than 60 degrees and less than or equal to 90 degrees.

15. The light detector of claim 14, wherein the angle is 90 degrees.

16. The light detector of claim 1, wherein a three-layered stereoscopic structure is formed at an intersection of the first carbon nanotube, and the semiconductor layer, and the second carbon nanotube.

17. The light detector of claim 16, wherein a cross-sectional area of the three-layered stereoscopic structure ranges from about 0.25 $nm^2$ to about 1000 $nm^2$.

18. The light detector of claim 17, wherein the cross-sectional area of the three-layered stereoscopic structure ranges from about 0.25 $nm^2$ to about 100 $nm^2$.

\* \* \* \* \*